(12) United States Patent
Liskow et al.

(10) Patent No.: US 9,642,288 B2
(45) Date of Patent: May 2, 2017

(54) CONTROL DEVICE AND METHOD FOR PRODUCING A CONTROL DEVICE FOR A MOTOR VEHICLE

(71) Applicant: Robert Bosch GmbH, Stuttgart (DE)

(72) Inventors: Uwe Liskow, Asperg (DE); Peter Klobes, Bietigheim (DE); Thomas Meier, Oberriexingen (DE)

(73) Assignee: Robert Bosch GmbH, Stuttgart (DE)

( * ) Notice: Subject to any disclaimer, the term of this patent is extended or adjusted under 35 U.S.C. 154(b) by 120 days.

(21) Appl. No.: 14/367,180

(22) PCT Filed: Nov. 14, 2012

(86) PCT No.: PCT/EP2012/072610
§ 371 (c)(1),
(2) Date: Jun. 19, 2014

(87) PCT Pub. No.: WO2013/092014
PCT Pub. Date: Jun. 27, 2013

(65) Prior Publication Data
US 2015/0029669 A1    Jan. 29, 2015

(30) Foreign Application Priority Data
Dec. 19, 2011  (DE) .......................... 10 2011 088 970

(51) Int. Cl.
*H05K 7/00*    (2006.01)
*H05K 5/00*    (2006.01)
(Continued)

(52) U.S. Cl.
CPC ..... *H05K 7/20854* (2013.01); *F16H 61/0006* (2013.01); *H05K 1/0204* (2013.01);
(Continued)

(58) Field of Classification Search
CPC .................................................. F16H 61/0006
(Continued)

(56) References Cited

U.S. PATENT DOCUMENTS

| 2004/0035245 A1* | 2/2004 | Albert | F16H 61/0006 |
| | | | 74/606 A |
| 2008/0156462 A1* | 7/2008 | Arik | F04B 43/04 |
| | | | 165/80.4 |

FOREIGN PATENT DOCUMENTS

| DE | 39 16 899 A1 | 11/1990 |
| DE | 198 59 739 A1 | 7/2000 |
| DE | 199 07 949 A1 | 9/2000 |

OTHER PUBLICATIONS

International Search Report corresponding to PCT Application No. PCT/EP2012/072610, mailed Jun. 5, 2013 (German and English language document) (5 pages).

\* cited by examiner

*Primary Examiner* — Jerry Wu
(74) *Attorney, Agent, or Firm* — Maginot, Moore & Beck LLP

(57) ABSTRACT

A control device includes a first circuit carrier with electrical components that are electrically conductively connected to one another and a second circuit carrier with electrical components that are electrically conductively connected to one another. The first circuit carrier and the second circuit carrier are electrically conductively connected to one another. The second circuit carrier is fixedly connected in thermally conductive fashion to a fluid-tight thermally conductive carrier element. The second circuit carrier and the carrier element are arranged in a cutout of the first circuit carrier. The carrier element has better thermal conductivity than the first circuit carrier and can be thermally conductively connected to a heat sink. The carrier element is
(Continued)

integrated in fluid-tight fashion in an internal region of the first circuit carrier.

15 Claims, 3 Drawing Sheets

(51) Int. Cl.
*H05K 7/20* (2006.01)
*F16H 61/00* (2006.01)
*H05K 1/02* (2006.01)
*H05K 3/30* (2006.01)
*H05K 1/14* (2006.01)

(52) U.S. Cl.
CPC ........... *H05K 3/301* (2013.01); *H05K 5/0082* (2013.01); *H05K 7/209* (2013.01); *H01L 2224/48091* (2013.01); *H01L 2224/48472* (2013.01); *H01L 2224/73265* (2013.01); *H05K 1/142* (2013.01); *Y10T 29/4913* (2015.01)

(58) Field of Classification Search
USPC ........................................ 361/679.01, 679.52
See application file for complete search history.

CONTROL DEVICE AND METHOD FOR PRODUCING A CONTROL DEVICE FOR A MOTOR VEHICLE

This application is a 35 U.S.C §371 National Stage Application of PCT/EP2012/072610, filed on Nov. 14, 2012, which claims the benefit of priority to Serial No. DE 10 2011 088 970.1, filed on Dec. 19, 2011 in Germany, the disclosures of which are incorporated herein by reference in their entirety.

BACKGROUND

Electronic control devices are required to control various applications in motor vehicle construction. The electronic control devices contain electronic components such as control modules for driving actuators and sensors, and also at least one plug connection for connection to a vehicle cable harness. Electronic controller modules which in many cases are arranged in the interior of the transmission housing are required to control modern automatic transmissions. In this case, the control modules are installed such that they are entirely or partially covered by transmission fluid and are exposed to temperatures of −40° C. to +150° C. which can occur in transmissions of this kind. Control modules of this kind develop a large quantity of heat during operation, it being necessary to dissipate this quantity of heat in order to prevent control modules of this kind overheating. It is known to fixedly arrange said control modules on so-called mount boards which are produced from aluminum and have a thickness of approximately 5 mm, in order to introduce the heat which is emitted by the control module into the mount board. In this case, the control module is surrounded by a printed circuit board which is used to make contact with the control module. The printed circuit board is fixedly connected, for example by adhesive bonding, screwing or riveting, to the mount board for reasons of stability. However, mount boards of this kind not only form a heat sink, but rather also form a heat store on account of their volume. In addition, control devices of this kind are extremely heavy on account of the weight of the mount board, wherein the mount board can make up fifty percent by weight and more of the total weight of the control module.

SUMMARY

There may therefore be a requirement to provide a control device which can dissipate heat from the controller module in an improved manner.

The requirement can be satisfied by the subject matter of the disclosure. Advantageous refinements of the disclosure can be found in the subjects of the dependent patent claims.

According to a first exemplary refinement of the disclosure, a control device for a motor vehicle is provided, wherein the control device has a first circuit mount with electrical components which are electrically conductively connected to one another, and a second circuit mount with electrical components which are electrically conductively connected to one another. The first circuit mount and the second circuit mount are electrically conductively connected to one another. The second circuit mount is thermally conductively and fixedly connected to a fluid-tight thermally conductive mount element. The first circuit mount has a recess, wherein the second circuit mount is arranged in the recess. The mount element is arranged in the recess. The mount element has a better thermal conductivity than the first circuit mount. The mount element can be thermally conductively connected to a heat sink. The mount element is integrated into an inner region of the first circuit mount in a fluid-tight manner.

The mount element can be completely enclosed by the first circuit mount, apart from two regions. The heat sink can be coupled to the mount element in one region, and the second circuit mount is fixedly connected to the mount element in the other region. In this case, the mount element can be incorporated into the first circuit mount, for example by embedding or incorporation by lamination. The mount element can be of self-supporting design in such a way that the second circuit mount is held stable by the mount element, even under the influence of a fluid as heat sink. The second circuit mount can be pressed against the mount element, for example, by means of technical springs. The second circuit mount can also be adhesively bonded to the mount element. The connection between the second circuit mount and the mount element can be designed in such a way that the second circuit mount can output its heat directly to the mount element, wherein there is no thermal insulation layer, for example printed circuit board material, between the second circuit mount and the mount element. The second circuit mount can also be in the form of a control module for controlling transmission functions in modern automatic transmissions. The first circuit mount will generally be in the form of a rigid printed circuit board, wherein the printed circuit board is composed of glass-fiber woven fabric and epoxy resin and therefore has a quality of FR4 or more. In this case, FR stands for flame retardant. The printed circuit board can be in the form of a low-current printed circuit board with copper tracks which are, for example, 35 μm to 70 μm thick or in the form of a high-current printed circuit board with copper tracks which are, for example, 100 μm to 400 μm thick. High-current paths with a thickness of more than 400 μm, that is to say, for example, 1 mm, 2 mm or more, can also be inserted into the printed circuit board. The first circuit mount, for example, can also have an aperture which extends from a top face to a bottom face, which is situated opposite the top face, and is closed in a fluid-tight manner by the mount element which is, for example, 1 mm thick and extends in the longitudinal direction of extent of the first circuit mount. In this case, the mount element can end at a side wall of the aperture or be designed to be larger than the aperture and accordingly project into the first circuit mount. When the control device is used, for example, in an automatic transmission of a motor vehicle, the control device is therefore located within the transmission housing of the automatic transmission; the automatic transmission fluid can also be used as heat sink, for example. In this case, the automatic transmission fluid can be routed to the mount element in such a way that the automatic transmission fluid can dissipate the heat, which is generated by the second circuit mount and introduced into the mount element, from the mount element. The transmission housing itself or a control plate which is arranged in the transmission housing can also be in the form of a heat sink. In this case, the mount element is thermally conductively connected to the transmission housing or to the control plate. The mount element can be designed in such a way that a first receiving face for the second circuit mount and/or a second receiving face for the heat sink are/is formed. In this case, the second receiving faces for the heat sink can be formed in such a way that a solid body can be thermally conductively connected to the second receiving face, or that the second receiving face has conductive areas for conducting a liquid or gaseous fluid. The mount element can be of fluid-tight design. The second receiving face of the mount element can be arranged adjacent to the first receiving face or opposite the first receiving face. The second receiving face will generally be designed opposite the first receiving face since, in a refinement of this kind, the heat sink can be arranged closer to the second circuit mount. The second receiving face can be of planar design, for example. If the second receiving face is arranged opposite the first receiving face, the second receiving face can be flush with one side of the first circuit mount which is in the form of a printed circuit board. The first receiving face can likewise be of planar design, for example. Therefore, the mount element can be in the form of a board. Since the mount element can be designed to be thinner than the first circuit mount, the first receiving face can be set back in relation to another side of the first circuit mount which is in the form of a printed circuit board, so that the second circuit mount can be arranged at least partially within the first circuit mount. The control device can therefore be of flat configuration. Owing to the low thickness of the mount element, the heat which is generated by the second circuit mount can additionally be conducted into the heat sink virtually without loss. The mount element, although it may be designed to be electrically conductive, is used solely to transmit heat, but not to transmit electrical current. The first circuit mount and the second circuit mount will generally be electrically conductively connected to one another by means of bonding wires, wherein the bonding wires can be arranged on the second circuit mount in order to simplify production. However, in order to ensure good thermal dissipation from the second circuit mount into the mount element, the second circuit mount will be spaced apart from the first circuit mount at the periphery. It can be considered an advantage that the first circuit mount in conjunction with the mount element is inherently stable in such a way that the first circuit mount does not need to be mounted on a known mount board for stabilization purposes. Furthermore, the heat which is generated by the second circuit mount can be rapidly dissipated with an only low level of thermal resistance by means of a heat sink. Owing to the low volume of the mount element, wherein the specific weight of the mount element will generally be greater than the specific weight of the first circuit mount, the control device can be designed to be considerably more lightweight than a control device which is known from the prior art.

According to a further exemplary refinement of the disclosure, the mount element has an edge region with a first side and a second side which is situated opposite the first side, wherein both the first side and also the second side are at least partially covered by the first circuit mount.

The first circuit mount, in particular when in the form of a flat printed circuit board, can have a top face and a bottom face which is situated opposite the top face, wherein the mount element is permanently connected to the first circuit mount between the top face and the bottom face. Therefore, the mount element can be located within the first circuit mount. The mount element can be covered at least at its connecting points to the first circuit mount by the top face and the bottom face of the circuit mount. The mount element can be inserted, or incorporated by lamination, into the printed circuit board, for example, during production of the first circuit mount. Incorporation by lamination is generally intended to be understood to mean that the mount element is integrated into the first circuit mount, for example, by means of epoxy resin, phenol resin or other resins during the production process of the printed circuit board. The printed circuit board which is in the form of a first circuit mount generally comprises at least two printed circuit board layers. A 4-layer printed circuit board is generally produced by coating both sides of an inner layer core, which is coated on both sides with copper, initially with a prepreg and finally with a copper foil. In this case, the prefabricated printed circuit board layers can already contain cutouts into which the mount element is inserted during lamination of the individual printed circuit board layers. Since the individual printed circuit board layers are generally connected to one another by means of resin which is cured under pressure and heat, the mount element can be incorporated into the first circuit mount during this process. Therefore, the first circuit mount with the mount element can have a thickness of approximately 2 mm for example, while the mount element is designed, for example, merely as a board which is 1 mm thick.

According to a further exemplary refinement of the disclosure, the mount element extends along a longitudinal direction of extent of the first circuit mount.

According to a further exemplary refinement of the disclosure, the mount element is in the form of a board.

In this case, the mount element can be produced in a particularly simple and low-cost manner and can be arranged within the first circuit mount in a simple manner. To this end, the board can be cut out of a metal sheet for example. The board will generally be designed in such a way that its dimensions in the direction of extent of the first circuit mount are smaller than the dimensions of the first circuit mount, so that the narrow faces of the mount element are enclosed by the first circuit mount.

According to a further exemplary refinement of the disclosure, the mount element has a thickness, wherein the thickness is greater than 0.4 mm.

At this thickness, the mount element can have a sufficient degree of stability for receiving the second circuit mount and for receiving the heat sink. However, the mount element will generally have a thickness of approximately 1 mm.

According to a further exemplary refinement of the disclosure, the mount element is produced from a material which is selected from the group comprising copper, copper alloy, aluminum, aluminum alloy and nickel alloy.

Precisely these materials have an excellent thermal conductivity, in order to conduct the heat which is generated by the second circuit mount into the heat sink without loss as far as possible. A typical representative of the nickel alloy in conjunction with good thermal conductivity is nickel silver. Since the mount element can be of electrically insulating design, a highly thermally conductive plastic can also be used as the mount element. On account of the different coefficients of thermal expansion of the base material of the printed circuit board and of the material of the mount element, the two materials are generally matched to one another in such a way that there is no delamination of the mount element and printed circuit board during subsequent operation.

According to a further exemplary refinement of the disclosure, the first recess in the first circuit mount is in the form of a first cutout, wherein the first cutout is of pan-like design in such a way that a first side wall is formed by the first circuit mount. The first side wall and the mount element are connected to one another in a fluid-tight manner.

The second circuit mount can therefore be arranged within the first circuit mount, wherein the overall design of the control device can be small.

According to a further exemplary refinement of the disclosure, the first circuit mount has a second cutout which is different from the first cutout. The second cutout is of pan-like design in such a way that a second side wall is formed by the first circuit mount. The second side wall and the mount element are connected to one another in a fluid-tight manner.

The two cutouts can therefore be arranged adjacent to one another or opposite one another in the first circuit mount. The cutouts can be provided during production of the circuit mount by no material, such as a glass-fiber mat and/or epoxy resin, being provided at the locations of the cutouts. The cutouts can also be formed after production of the first circuit mount by the printed circuit board material which covers the mount element being removed by mechanical processing, for example milling.

According to a further exemplary refinement of the disclosure, the second cutout is in the form of a groove, wherein the groove extends from a first side face of the first circuit mount to a second side face, which is different from the first side face, of the first circuit mount.

A groove is suitable in particular when the heat sink is a liquid or gaseous fluid. The fluid can be correspondingly deflected by the groove in order to carry away the heat, which is generated by the second circuit mount and introduced into the mount element, as quickly as possible from the mount element.

According to a further exemplary refinement of the disclosure, the first cutout and the second cutout are arranged in alignment.

Therefore, the first cutout and the second cutout can be arranged in a manner situated opposite one another, wherein the first cutout is separated from the second cutout by the mount element. In conjunction with the thin board-like mount element, the transportation of heat is particularly effective since the heat sink and the heat generator, specifically the second circuit mount, are positioned opposite one another and are separated from one another only by the mount element.

According to a further exemplary refinement of the disclosure, the first cutout and the second cutout are congruent.

As a result, it is possible to produce individual printed circuit board layers in a particularly simple manner, said individual printed circuit board layers being connected at a later time to form an overall printed circuit board, specifically the first circuit mount. Owing to the first cutout and the second cutout being congruent, the mount element can be designed to be only slightly larger than one of the two cutouts.

According to a further exemplary refinement of the disclosure, the second circuit mount is produced on the basis of sintered ceramic mounts.

A typical representative of this technology is LTCC (Low Temperature Cofired Ceramics) or a ceramic substrate produced using thick-film technology. In this case, the circuit mount is produced from a material which is highly thermally conductive, specifically ceramic. The thermal conductivity of the second circuit mount can be considerably higher than the thermal conductivity of the first circuit mount, in particular when the first circuit mount is produced from glass fiber and resin. As a result, the heat which is generated by the first circuit mount can be rapidly introduced into the mount element. It goes without saying that the second circuit mount can also be in the form of a single- or multiple-layer printed circuit board, wherein the second circuit mount can also be designed as an HDI (High-Density-Interconnect) printed circuit board.

According to a further exemplary refinement of the disclosure, the second circuit mount and the mount element are adhesively bonded to one another.

The adhesive will generally be designed to be highly thermally conductive in order to rapidly transmit the heat from the second circuit mount into the mount element. Adhesive bonding is a particularly simple way of joining two elements. It goes without saying that the second circuit mount and the mount element could be soldered to one another. In this case, both soldering and adhesive bonding are cohesive connections.

According to a further exemplary refinement of the disclosure, a cover structure is fixedly connected to the first circuit mount. The first circuit mount, the mount element and the cover structure bound an internal space, wherein the internal space is separated from an external space in a fluid-tight manner. The second circuit mount is arranged in the internal space.

A refinement of this kind makes it possible for a fluid which is in the form of a heat sink to wash around the control device. In this way, the control device can be arranged, for example, within an automatic transmission without automatic transmission fluid coming into contact with the internal space in the control device. The cover structure can be produced, for example, from plastic or metal. The plastic which is used for the cover structure can also be fiber-reinforced.

According to a further exemplary refinement of the disclosure, the first circuit mount extends to an electrical component which is arranged in the external space. The electrical component which is arranged in the external space is electrically conductively connected to the second circuit mount.

The electrical components which are arranged in the external space will usually be sensors or plug connectors which are fixedly connected to the first circuit mount and which can be electrically conductively connected to actuators, for example electric motors.

According to a further exemplary refinement of the disclosure, the cover structure and the second circuit mount are adhesively bonded to one another.

This results in a particularly simple and cost-saving fluid-tight connection between the cover structure and the second circuit mount.

According to a further exemplary refinement of the disclosure, the cover structure has a sealing element, wherein the sealing element is designed to prevent any ingress of fluid from the external space into the internal space between the cover structure and the second circuit mount.

As a result, the second circuit mount does not come into connection with the fluid which surrounds the control device, that is to say automatic transmission fluid, or with particulate matter which may be contained in the automatic transmission fluid. In particular, the particulate matter may possibly be electrically conductive on account of abraded metallic material.

According to a further exemplary refinement of the disclosure, an automatic transmission for a motor vehicle has, as described above, a control device having a transmission housing, wherein the control device is arranged within the transmission housing.

A method for producing a control device for a motor vehicle is provided according to a further exemplary refinement of the disclosure, wherein the method comprises the following steps: embedding a mount element into a first circuit mount during the production process of said circuit mount in a fluid-tight manner, exposing a central region of the mount element by producing a recess, positioning and connecting a second circuit mount together with its electrical components in a highly thermally conductive manner, connecting the first circuit mount and the second circuit mount in an electrically conductive manner, fixedly connecting a cover structure to the first circuit mount in a fluid-tight manner, connecting electrical components to the first circuit mount in an electrically conductive manner.

It should be noted that concepts relating to the disclosure are described herein in conjunction with a control device and also with a method for producing a control device. It is clear to a person skilled in the art here that the individual described features can be combined with one another in different ways in order to thereby also arrive at other refinements of the disclosure.

BRIEF DESCRIPTION OF THE DRAWINGS

Embodiments of the disclosure will be described in the text which follows with reference to the attached figures. The figures are merely schematic and are not true-to-scale.

DETAILED DESCRIPTION

Figure 1:
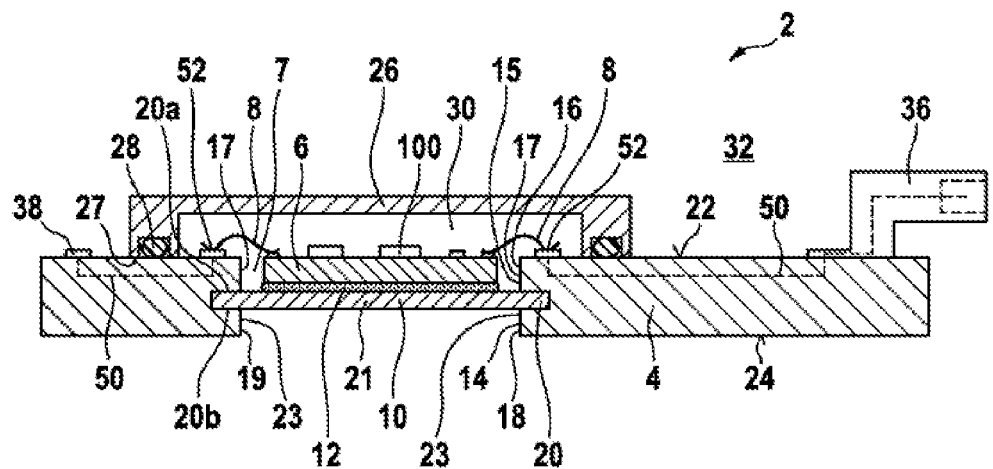
FIG. 1 shows a cross section through a control device having a first and a second circuit mount, wherein the second circuit mount is arranged on a mount element which is incorporated by lamination into the first circuit mount.

FIG. 1 shows a control device 2 which is in the form of a control device 2 for automatic transmissions of modern motor vehicles. The control device 2 has a first circuit mount 4 and a second circuit mount 6, wherein the first circuit mount 4 and the second circuit mount 6 are separated from one another at the periphery by means of a gap 7. The first circuit mount 4 and the second circuit mount 6 are electrically conductively connected to one another by means of bonding wires 8. The second circuit mount 6 and a fluid-tight thermally conductive mount element 10 are thermally conductively and fixedly connected to one another by means of a highly thermally conductive adhesive 12. The mount element 10 is in the form of a board and in the present exemplary refinement is composed of an aluminum alloy. The mount element 10 can also be produced from a copper or nickel alloy. The first circuit mount 4 is designed as a printed circuit board. The printed circuit board is produced from resin in conjunction with a glass-fiber woven fabric or a glass-fiber nonwoven fabric, wherein the quality of the first circuit mount is FR4 or more. The second circuit mount 6 is produced using LTCC (Low Temperature Cofired Ceramic), thick-film ceramic, printed circuit board or HDI (High-Density-Interconnect) printed circuit board technology. The mount element 10 is integrated into an inner region 14 of the first circuit mount 4 in a fluid-tight manner. The mount element 10 forms an edge region 20 which is incorporated by lamination into the first circuit mount 4 in a fluid-tight manner. The mount element 10 has a thickness of approximately 1 mm. The first circuit mount 4 has a recess 15 which is designed as a first pan-like cutout 16. In this case, the pan-like first cutout 16 has a first side wall 17 which is formed by the first circuit mount 4. The first side wall 17 and the mount element 10 are connected to one another in a fluid-tight manner. A pan-like second cutout 18 is arranged opposite the first cutout 16. The second side wall 23 of said second cutout is also formed by the first circuit mount 4. The second side wall 23 and the mount element 10 are connected to one another in a fluid-tight manner in this case too. The first cutout 16 and the second cutout 18 are in alignment. Furthermore, the first cutout 16 and the second cutout 18 are of congruent design in the exemplary embodiment described here. Therefore, the first cutout 16 and the second cutout 18 without the mount element 10 can be considered to be an opening 19 which extends from a top face 22 of the first circuit mount 4 to a bottom face 24 of the circuit mount 4, which bottom face 24 is situated opposite the top face 22. In this case, the opening is bounded by the first side wall 17 and the second side wall 23. The ability to pass through the opening 19 is interrupted by the mount element 10 which spans the opening 19 in a bridge-like manner. The mount element is connected to the first circuit mount 4 in a fluid-tight manner at the periphery. To this end, the mount element 10 has an edge region 20 with a first side 20a and a second side 20b which is situated opposite the first side. The first side 20a and the second side 20b are covered by the first circuit mount 4. A central region 21 of the mount element 10, which central region is bounded by the edge region 20, is freely accessible from the top face 22 and also from the bottom face 24 of the first circuit mount 4. In this case, the second circuit mount 6 is arranged on the central region 21 of the mount element 10. A cover structure 26 which is of pan-like design is fixedly connected to the top face 22 of the first circuit mount 4. The cover structure 26 has an edge 27 of U-shaped design which faces the top face 22 of the first circuit mount 4 and in which a peripheral sealing element 28 which is in the form of an O-ring is arranged. Therefore, an internal space 30 is bounded by the first circuit mount 4, the mount element 10 and the cover structure 26, said internal space being separated from an external space 32 in a fluid-tight manner. The second circuit mount 6, together with its electrical components 100, is arranged in the internal space 30. Electrical components which are arranged on the second circuit mount 6 and are in the form of a plug 36 and also a sensor 38 are located in the external space 32. Conductor tracks 50 are arranged within the first circuit mount 4, said conductor tracks connecting the electrical components 36, 38 which are arranged outside the internal space 30 to contact points 52 which are arranged within the internal space 30.

Since the second circuit mount 6 is arranged within the recess 15, the control device 2 is of very flat construction. The heat which is generated by the first circuit mount 4 is conducted into the mount element 10 virtually without thermal resistance. Since the mount element 10 has only a low volume, virtually no heat is stored, as is desired. In order to dissipate the heat which is present in the mount element 10, a heat sink can be arranged on the mount element 10, as is illustrated in the following FIGS. 2 and 3.

Figure 2:
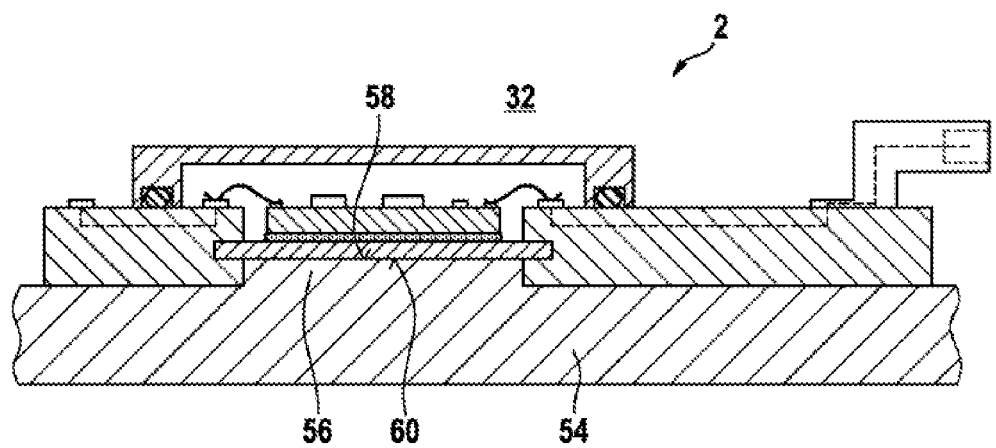
FIG. 2 shows a cross section through the control device which is known from FIG. 1 in conjunction with a heat sink which is in the form of a hydraulic plate.

FIG. 2 shows a cross section through the control device 2 which is known from FIG. 1 in conjunction with a heat sink which is in the form of a hydraulic plate 54. The hydraulic plate 54 has a projection 56 which has a receiving face 58 which corresponds to a lower face 60 of the mount element 10. In this case, the receiving face 58 of the hydraulic plate 54 and the lower face 60 of the mount element are thermally conductively connected to one another. Therefore, the heat which is present in the mount element 10 can be introduced into the hydraulic plate 54.

Figure 3:
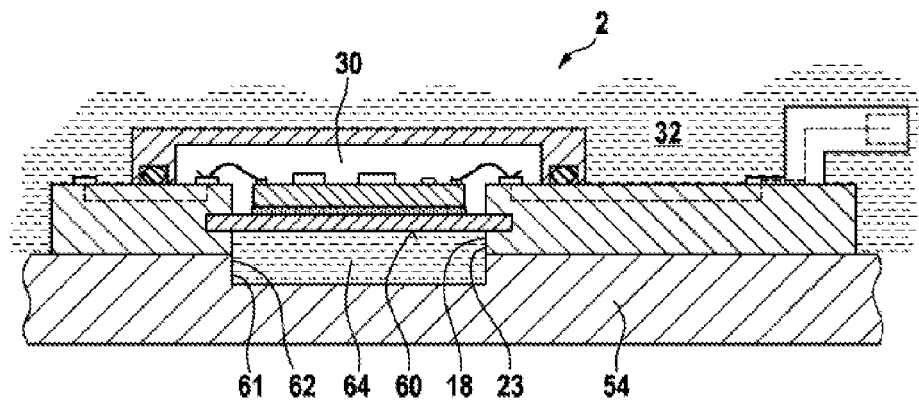
FIG. 3 shows a cross section through the control device which is known from FIG. 1 in conjunction with a heat sink which is in the form of a fluid.

FIG. 3 shows the control device 2 which is known from FIG. 1 in conjunction with a heat sink which is formed from automatic transmission fluid 64. In this case, a groove 61 is formed in the hydraulic plate 54. The groove 61 forms a channel 62 together with the second side wall 23 of the second cutout 18 and the lower face 60 of the mount element 10, the automatic transmission fluid 64 being carried in said channel. In addition, the automatic transmission fluid 64 is also located in the external space 32. In particular, the mount element 10 is connected to the first circuit mount 4 in a fluid-tight manner in such a way that no automatic transmission fluid 64 can pass from the channel 62 into the internal space 30 in the control device 2. In the channel 62, the automatic transmission fluid 64 is supplied to the mount element 10 in order to dissipate the heat which is present in the mount element 10 by means of the automatic transmission fluid 64. In particular, the channel 62 is designed in such a way that the automatic transmission fluid 64 which is carried in the channel 62 circulates, in order to dissipate the heat from the mount board 10 in as effective a manner as possible.

Figure 4:
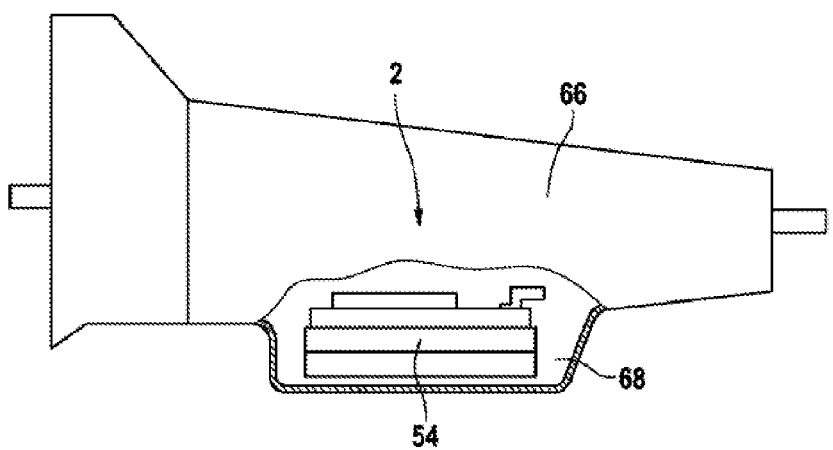
FIG. 4 shows an x-ray view of the control device which is known from FIG. 2 and which is incorporated in an automatic transmission of a motor vehicle.

FIG. 4 shows an automatic transmission 66 with an oil pan 68. In this case, the hydraulic plate 54 which is known from FIG. 2 and/or FIG. 3 and has the control device 2 is arranged in the oil pan 68 of the automatic transmission 66, wherein the oil pan 68 is cooled during operation of the motor vehicle by a flow of air, so that the heat which is conducted into the hydraulic plate 54 can be drawn away across the oil pan 68 by the flow of air.

Figure 5:
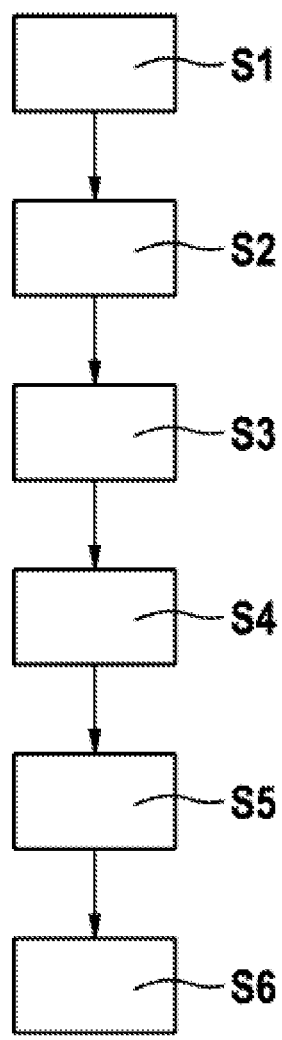
FIG. 5 shows a method for producing the control device which is known from FIGS. 1 to 4 for an automatic transmission of a motor vehicle.

FIG. 5 shows a method for producing the control device 2 for the automatic transmission 66 of a motor vehicle. In this case, the method comprises the following steps: in a first method step S1, the mount element 10 is embedded into the first circuit mount 4 during a printed circuit board production process in such a way that it is fluid-tight during subsequent operation. In a further method step S2, the central region 21 of the mount element 10 is exposed by milling the recess 15 in the form of the first cutout 16 and milling the second cutout 18. This method step S2 can be dispensed with if printed circuit board layers have the two cutouts 16, 18 before pressing and curing. In this method step, the central region 21 is provided in a metallically bare manner. In a further method step S3, the second circuit mount 6 together with its electrical components 100 are positioned on the central region 21 and said second circuit mount is connected to the central region 21 in a highly thermally conductive manner. This can be achieved, for example, by pressing the second circuit mount 6 against the central region 21 or by adhesively bonding the central region 21 and the the second circuit mount 6. In a further method step S4, the first circuit mount 4 and the second circuit mount 6 are electrically conductively connected to one another, for example, by bonding wires 8 or other electrical connecting elements. In a further method step S5, a cover structure 26 is fixedly connected to a top face 22 of the first circuit mount 4 in a fluid-tight manner. In a further method step S6, further electrical components 36, 48 are permanently fastened and electrically conductively connected to the first circuit mount 4.

The invention claimed is:

1. A control device for a motor vehicle, comprising:
a first circuit mount including electrical components that are electrically conductively connected to one another; and a second circuit mount including electrical components that are electrically conductively connected to one another, wherein the first circuit mount and the second circuit mount are electrically conductively connected to one another, wherein the second circuit mount is thermally conductively and fixedly connected to a fluid-tight thermally conductive mount element, wherein the first circuit mount has a recess with a through hole extending completely through the first circuit mount, the second circuit mount being arranged in the recess, and wherein the mount element (i) is arranged in the recess, (ii) has a better thermal conductivity than the first circuit mount, (iii) is configured to be thermally conductively connected to a heat sink, and (iv) is laminated into an inner edge region of the first circuit mount in a fluid-tight manner.

2. The control device as claimed in claim 1, wherein the mount element has an edge region with a first side and a second side that is situated opposite the first side, and wherein both the first side and the second side are at least partially covered by the first circuit mount.

3. The control device as claimed in claim 1, wherein the mount element is formed from a material selected from the group comprising copper, copper alloy, aluminum, aluminum alloy, and nickel alloy.

4. The control device as claimed in claim 1, wherein:
the first circuit mount defines a top face,
the mount element defines a top side,
a first side wall of the first circuit mount extends from the top face to the top side, and
the first side wall and the mount element are connected to one another in a fluid-tight manner.

5. The control device as claimed in claim 4, wherein:
the first circuit mount defines a bottom face opposite of the top face,
the mount element defines a bottom side opposite of the top side,
a second side wall of the first circuit mount extends from the bottom face to the bottom side, and
the second side wall and the mount element are connected to one another in a fluid-tight manner.

6. The control device as claimed in claim 5, wherein the first cutout and the second cutout are arranged in alignment, such that the first side wall and the second side wall are aligned.

7. The control device as claimed in claim 1, further comprising:
a cover structure fixedly connected to the first circuit mount,
wherein the first circuit mount, the mount element, and the cover structure bound an internal space,
wherein the internal space is separated from an external space in a fluid-tight manner, and
wherein the second circuit mount is arranged in the internal space.

8. The control device as claimed in claim 7, wherein the cover structure and the first circuit mount are adhesively bonded to one another.

9. The control device as claimed in claim 7, wherein the cover structure has a sealing element, the sealing element being configured to prevent any ingress of fluid from the external space into the internal space between the cover structure and the first circuit mount.

10. The control device as claimed in claim 1, wherein the recess is closed in a fluid-tight manner by the mount element.

11. The control device as claimed in claim 1, wherein:
the first circuit mount is formed from a printed circuit board, and
an edge region of the mount element is incorporated by lamination into the printed circuit board of the first circuit mount in a fluid-tight manner.

12. The control device as claimed in claim 11, wherein the printed circuit board includes at least one of glass-fiber and epoxy resin.

13. A control device for a motor vehicle, comprising:
a first circuit mount formed from a printed circuit board including electrical components that are electrically conductively connected to one another; and a second circuit mount including electrical components that are electrically conductively connected to one another, wherein the first circuit mount and the second circuit mount are electrically conductively connected to one another, wherein the second circuit mount is thermally conductively and fixedly connected to a fluid-tight thermally conductive mount element, wherein the first circuit mount has a recess with a through hole extending completely through the first circuit mount, the second circuit mount arranged in the recess, wherein an edge region of the mount element is incorporated by lamination into the printed circuit board of the first circuit mount in a fluid-tight manner, and wherein the mount element (i) is arranged in the recess, (ii) has a better thermal conductivity than the first circuit mount, (iii) is configured to be thermally conductively connected to a heat sink, and (iv) is integrated into an inner edge region of the first circuit mount in a fluid-tight manner.

14. The control device as claimed in claim 13, wherein the recess is closed in a fluid-tight manner by the mount element.

15. The control device as claimed in claim 13, wherein the printed circuit board includes at least one of glass-fiber and epoxy resin.

* * * * *